(12) United States Patent
Border et al.

(10) Patent No.: US 6,740,474 B2
(45) Date of Patent: May 25, 2004

(54) TECHNIQUE FOR MAKING DEEP MICROSTRUCTURES IN PHOTORESIST

(75) Inventors: John Border, S. Wales, NY (US); Paul O. Mclaughlin, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 206 days.

(21) Appl. No.: 09/993,033

(22) Filed: Nov. 6, 2001

(65) Prior Publication Data

US 2003/0087200 A1 May 8, 2003

(51) Int. Cl.[7] .............................. G03F 7/00; B29D 11/00
(52) U.S. Cl. ........................ 430/322; 430/321; 430/324; 430/270.1; 264/1.2; 264/1.3; 264/401
(58) Field of Search ................................. 430/321–324, 430/270.1; 264/401

(56) References Cited

U.S. PATENT DOCUMENTS

| | | | |
|---|---|---|---|
| 4,340,654 A | | 7/1982 | Campi |
| 4,705,698 A | | 11/1987 | Van Dine |
| 5,462,700 A | * | 10/1995 | Beeson et al. ............. 264/1.27 |
| 5,545,367 A | * | 8/1996 | Bae et al. .................... 264/401 |
| 5,614,339 A | | 3/1997 | Tankovich |
| 5,683,601 A | | 11/1997 | Tatah |
| 5,782,460 A | * | 7/1998 | Kretzschmar et al. ..... 264/1.36 |
| 6,177,151 B1 | | 1/2001 | Chrisey et al. |

* cited by examiner

Primary Examiner—Mark F. Huff
Assistant Examiner—K. Sagar
(74) Attorney, Agent, or Firm—Mark G. Bocchetti

(57) ABSTRACT

A method is disclosed for making deep microstructures in photoresist. The method utilizes a pool of photoresist on top of a transparent substrate and the laser is located below the substrate. Structures are created in the photoresist by transmitting the laser light through the substrate up into the photoresist. Since the photoresist does not have to be spin coated onto the substrate, very thick layers of photoresist can be used while the thickness uniformity is determined by the substrate surface. Alternately, a contoured substrate can be used while producing uniform structures.

10 Claims, 6 Drawing Sheets

TECHNIQUE FOR MAKING DEEP MICROSTRUCTURES IN PHOTORESIST

FIELD OF THE INVENTION

The present invention relates generally to the field of photolithography and, more particularly, to methods for using photolithographic techniques for making optical structures such as lenses that are deeper than 100 micron.

BACKGROUND OF THE INVENTION

Photolithography is a technique that is well known for making semiconductors, microlenses, diffraction gratings, diffractive lenses, microelectronic structures etc. The outstanding characteristic of photolithography is that it is capable of producing complex structures with accuracy in the nanometer range.

Typically, in photolithography, a coating of photoresist is applied to a silicon or fused silica substrate such as a wafer. A laser is then used to write the desired structure into the photoresist from above the photoresist. By focusing the laser to a very small spot and moving the laser in a precisely controlled manner, extremely precise structures can be created in the photoresist. After the pattern has been written onto the photoresist, a chemical wash is used to remove the photoresist preferentially between the areas that have been exposed and those that have not been exposed, thereby leaving the structure as written.

The limitation with photolithography is in the depth of the structures that can be created. This limitation comes from a combination of the laser power, the transparency of the photoresist to the laser light, and the thickness of the photoresist layer. While laser power can be increased to create a deeper structure, and alternate photoresists or other wavelength lasers could be used to increase the effective transparency of the photoresist; the thickness of the photoresist can only be increased a limited amount.

Photoresist is a liquid material as it is applied to the wafer. In order to obtain a uniform thickness of the photoresist, a spin coating technique is typically used to spread the liquid photoresist over the substrate surface. For the final structure to be flat and of uniform depth, the photoresist must be applied very uniformly over the wafer surface. The spin coating technique is very good at creating a uniform coating in the range of 1–500 micron depending on the spin speed and the type of photoresist used. For many photoresists, the thickness range that is possible with spin coating is very narrow, for example the 3612 photoresist from Shipley (Marlborough, Mass.) is only capable of thicknesses of 1–1.6 micron and the SPR220 photoresist from Shipley is capable of 7–18 micron. At the other extreme is the SU8 photoresist from Microchem Corp (Newton, Mass.) that is capable of thicknesses of 2–500 micron on a spin coater. Above the maximum thicknesses listed, the photoresist flows off the edge of the wafer during spin coating.

In U.S. Pat. No. 4,340,654, Campi describes a process for repairing photomasks which have clear defects. The process uses a laser applied to a photomask on a substrate so that in areas where there is a hole in the photomask, the laser penetrates the photomask to an opaque powdered material which has been applied on the other side of the photomask. The laser then melts the powdered material only in the area of the defect, thereby fusing the melted material to the photomask and repairing the defect. The process, as described by Campi, is specifically directed at opaque photomasks using a thermally based process to fuse an opaque material that absorbs the radiant energy. In a further embodiment, Campi does present a variation on photomask repair and instead describes a similar technique for producing photomasks directly. In this case, Campi is focused on fusing opaque materials to make photomasks without requiring the use of the usual prior art techniques of first coating the substrate surface with a photoresist material. Consequently, the method presented by Campi is not applicable to making optical structures which by necessity are made of transparent photoresist materials and which are three dimensional with significant depth.

Van Dine also describes the use of a laser which is directed through a transparent substrate in U.S. Pat. No. 4,705,698. In this case however, the laser is used to scribe the substrate through ablation to create a separation between semiconductor layers. This approach is very different from using the laser to create an optical surface in photoresist.

Tankovich, in U.S. Pat. No. 5,614,339, also discloses the use of a laser through a transparent substrate to remove opaque printing through ablation on the opposite side for the purpose of enabling toner materials to be recycled. Again the laser is used in an approach that is only suitable for use with opaque materials.

In a variation on Tankovich, Chrisey, in U.S. Pat. No. 6,177,151, discloses a similar ablation approach with a laser transmitted through a transparent substrate to an opaque layer which ablates. However, in Chrisey, the ablated material is captured onto a receiving substrate, thereby creating a method for printing with the ablated material.

The prior art fails to teach a method suitable for making three-dimensional optical structures using photoresist. In addition, the thermal and ablation aspects disclosed in the prior art all involve significant transfer of energy from the laser in that the material either melts or is ablated. In creating an optical structure, the transfer of energy from the laser must be minimal to protect the optical properties of the photoresist material being processed. In addition, the prior art does not disclose methods suitable for building structures of significant depth.

SUMMARY OF THE INVENTION

It is an object of the present invention to provide a method for producing optical structures of a photoresist material which have a depth that is greater than 100 micron.

It is a further object of the present invention to disclose a method for making optical structures in photoresist at substantially greater thicknesses than can be provided by spin coated coatings.

It is a further object of the present invention to reduce the cost of making photoresist structures by eliminating the multiple spin coating steps needed to produce thick photoresist coatings for thick photoresist structures.

Briefly stated, these and numerous other features, objects and advantages of the present invention will become readily apparent upon a reading of the detailed description, claims and drawings set forth herein. These features, objects and advantages are accomplished by a method utilizing a pool of photoresist on top of a transparent substrate such that the laser can be located under the substrate. Optical structures can be created in the photoresist by moving the laser in a pattern that matches the desired optical structure and the laser beam is transmitted through the substrate and into the pool of photoresist.

By using a pool of photoresist on top of the substrate, the application of the photoresist is greatly simplified compared to spin coating in that it can be merely poured onto the substrate. If very thick layers of photoresist are desired, cylindrical walls can be attached to the edges of the substrate to create a container which can act to contain the liquid photoresist during processing. In this case, the thickness of the photoresist is limited only by the height of the walls of the container. In either case, the processing cost of the present invention in applying the photoresist is substantially less than spin coating since the process is much simpler.

By transmitting the laser through the substrate, the flatness of the base of the optical structure produced is determined by the flatness of the substrate rather than the flatness of the surface of the coated photoresist as in the prior art. Due to the extreme requirements of the semiconductor industry, substrates in the form of wafers of various materials can be easily obtained which are very flat. Alternately, the invention as described could be used with substrates that are intentionally contoured to create a photoresist structure on top of a contoured substrate such as in a micro device which has optical and mechanical or electrical features.

Thus, the present invention defines a technique to replace spin coating which will enable photoresists of all types to be effectively used at an increased thickness so that deeper optical structures can be made with uniform quality. The invention involves using wafers that are transparent to the laser that is used for writing onto the photoresist. The laser can then be located under the wafer and write up through the wafer onto the photoresist. By writing through the wafer, the photoresist can then be poured onto the wafer in any thickness and coating uniformity is no longer an issue since structure depth is determined by the laser writing process and flatness is determined by the wafer. The invention also enables optical structures to be created in photoresist on contoured substrates. The term "optical structures" as used herein is intended to include, for example, lenses, gratings, and arbitrary diffractive surfaces.

DETAILED DESCRIPTION OF THE INVENTION

Figure 1:
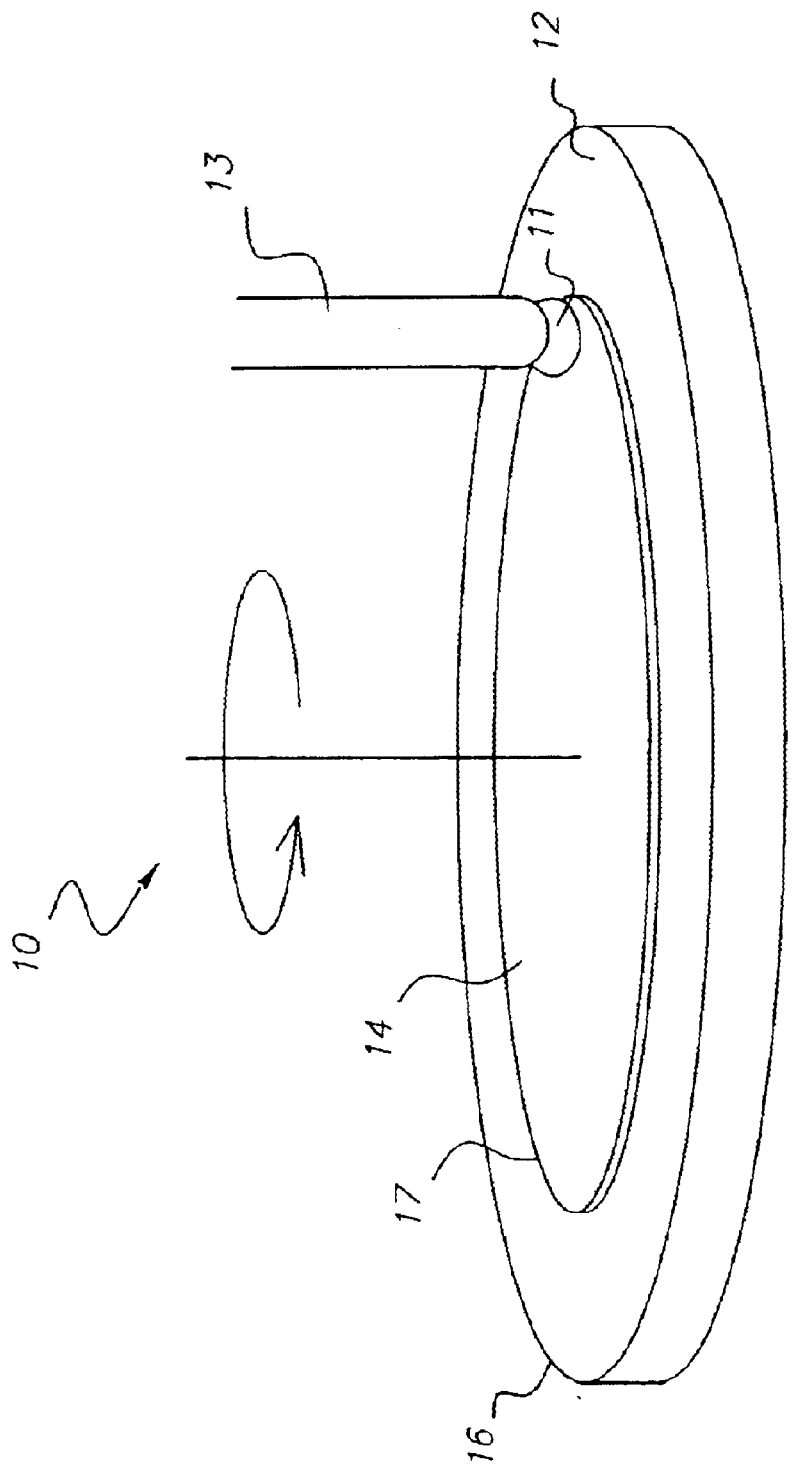
FIG. 1 is a schematic representation of the prior art spin coating process.

Turning first to FIG. 1 there is depicted a schematic of a prior art spin coating apparatus 10. A liquid photoresist 11 is delivered onto a substrate 12. It will be appreciated that spinning the substrate 12 does help to spread the liquid 11 more evenly across the substrate 12 in a thin layer 14. However, there is a limit to the thickness of the thin layer 14 that can be maintained on the substrate 12 before the centrifugal force from spinning makes the liquid spill off the edge 16 of the spinning substrate 12. In addition, the thickness of the coating 14 produced by spinning tends to be greater near the edge of the coating 17 particularly for thicker coatings 14.

Figure 2:
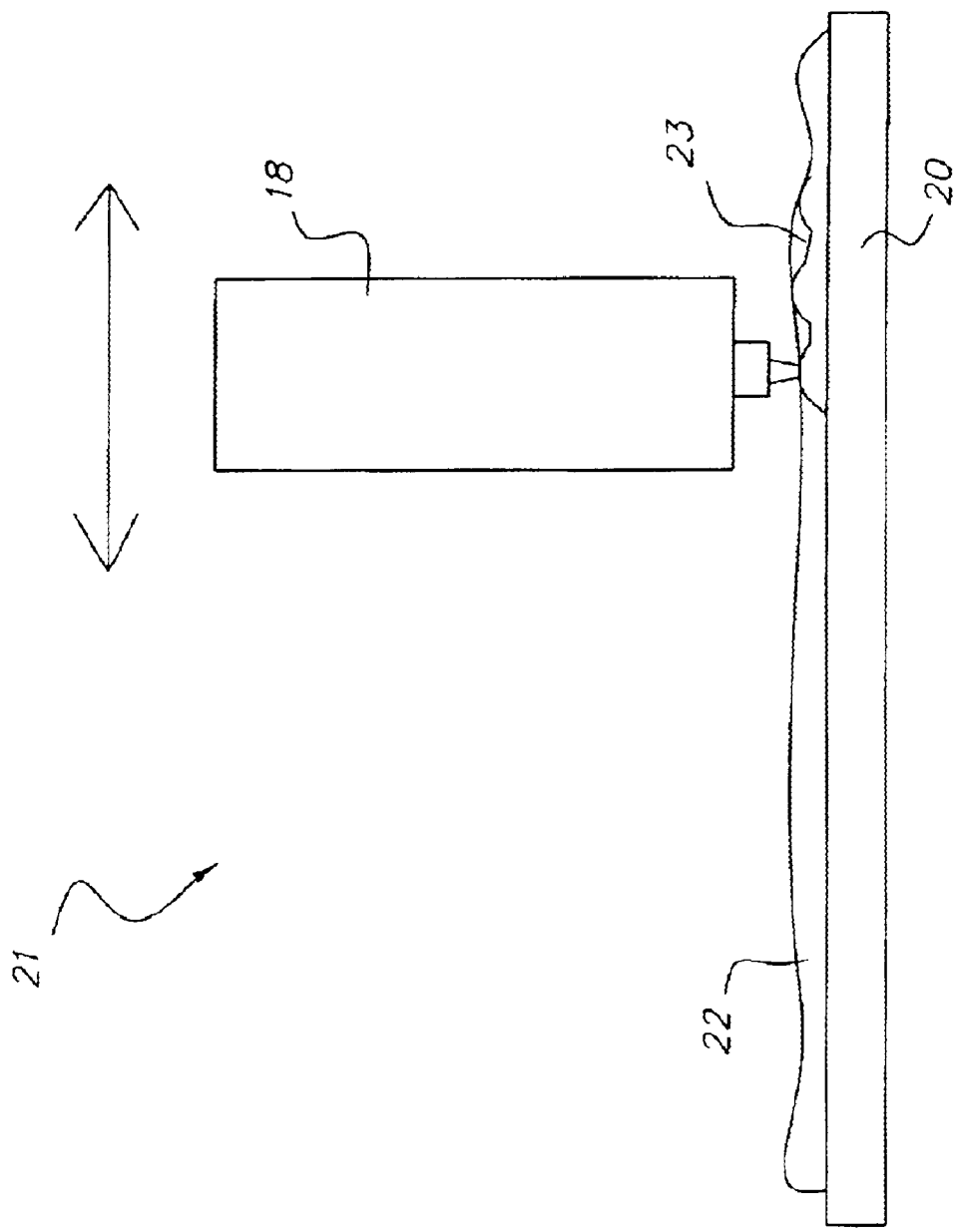
FIG. 2 is a side elevational representation of the prior art method for producing photoresist structures using a laser above a spin coated substrate.

Looking next at FIG. 2 there is shown the prior art process 21 wherein a laser 18 is located above a substrate 20. The photoresist coating 22 on the substrate 20 is shown schematically with the thickness nonuniformities that are typical for a spin coated photoresist coating 22. The photoresist coating 22 on substrate 20 is exposed in a predetermined pattern by moving the laser 18 over the photoresist coating 22 to create a structure 23 such as an optical article, from a series of areas that have been exposed and areas that have not been exposed. The photoresist coating 22 is then developed and if the photoresist is a positive photoresist material, the exposed areas are removed, thereby leaving the unexposed areas of the photoresist coating in the form of a structure 23 in photoresist material. For the case of a negative photoresist material, the unexposed areas of the resist are removed after developing, thereby leaving the exposed areas in the form of a structure 23. In this prior art case, since the laser 18 is located above the substrate 20 and the photoresist coating 22, the optical structures being produced in the photoresist coating 22 tends to form from the upper surface down into the photoresist coating 22 as limited by the size of the exposing area at the focal point of the laser so that any thickness nonuniformities present in the photoresist coating 22 influence the accuracy of the optical structure 23 that is produced.

Figure 3:
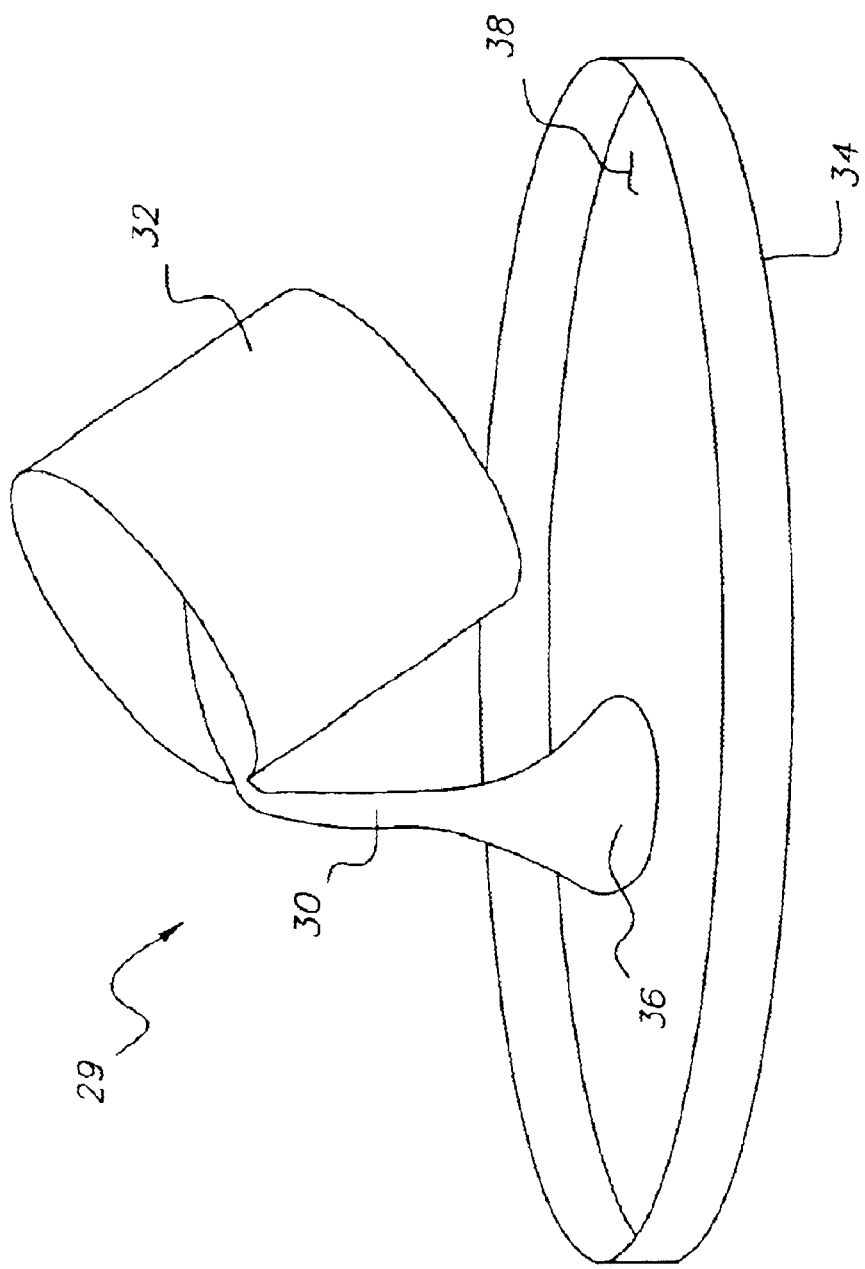
FIG. 3 is a schematic representation of the photoresist being poured onto the substrate to form a pool in the practice of the method of the present invention.

Turning to FIG. 3 a schematic illustration of an apparatus 29 that may be used in the practice of the method of the present invention is presented showing that a liquid photoresist 30 is poured such as, for example, from a container 32 onto a transparent substrate 34 so that the liquid photoresist forms a pool 36 on the top surface 38 of the transparent substrate 34. In this manner, the pool 36 results in a relatively thick layer of photoresist.

Figure 4:
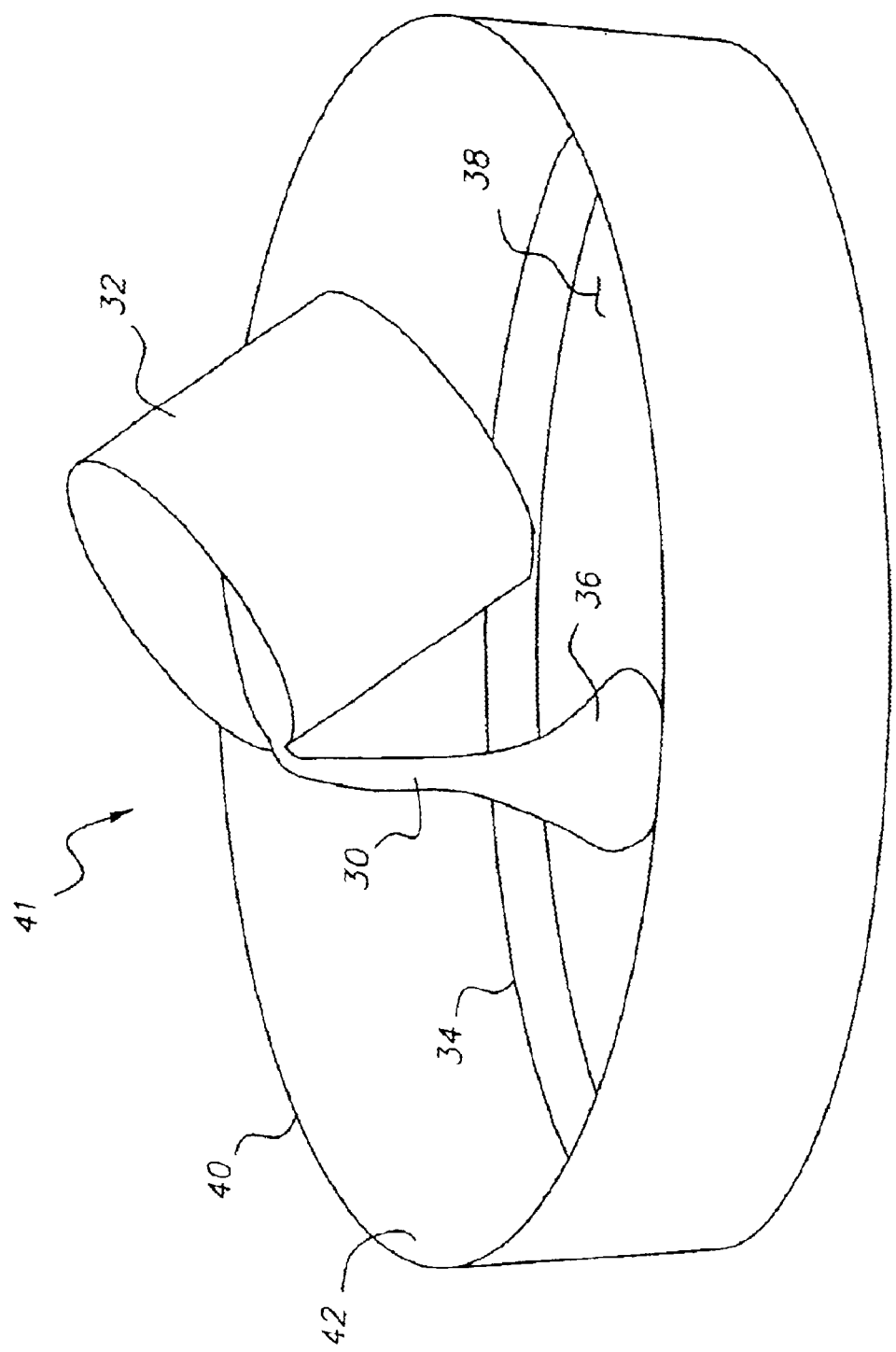
FIG. 4 is a schematic representation of the photoresist being poured into a container that has been attached to the edges of the substrate for very thick applications of photoresist in the practice of the method of the present invention.

FIG. 4 shows a schematic illustration of an alternative apparatus 41 that may be used in the practice of the method of the present invention in which to obtain a very thick layer of photoresist, a vertical wall member(s) 40 (see FIG. 4) may be attached to the edges or periphery of the transparent substrate 34 (shown in a typical but not required circular format). Again, a liquid photoresist 30 is poured such as, for example, from a container 32 onto a transparent substrate 34 so that the liquid photoresist forms a pool 36 on the top surface 38 of the transparent substrate 34. The vertical wall 40 is sealed to the transparent substrate 34 such that the liquid photoresist cannot flow through the interface therebetween. With the vertical wall 40 in place, a chamber 42 is created that is bounded by the vertical wall 40 so that the liquid photoresist can be held in a deep pool over the transparent substrate 34. The pool of photoresist can be processed in a liquid state or cured prior to exposure to form a thick layer of photoresist 37 as required by the type of photoresist.

Figure 5:
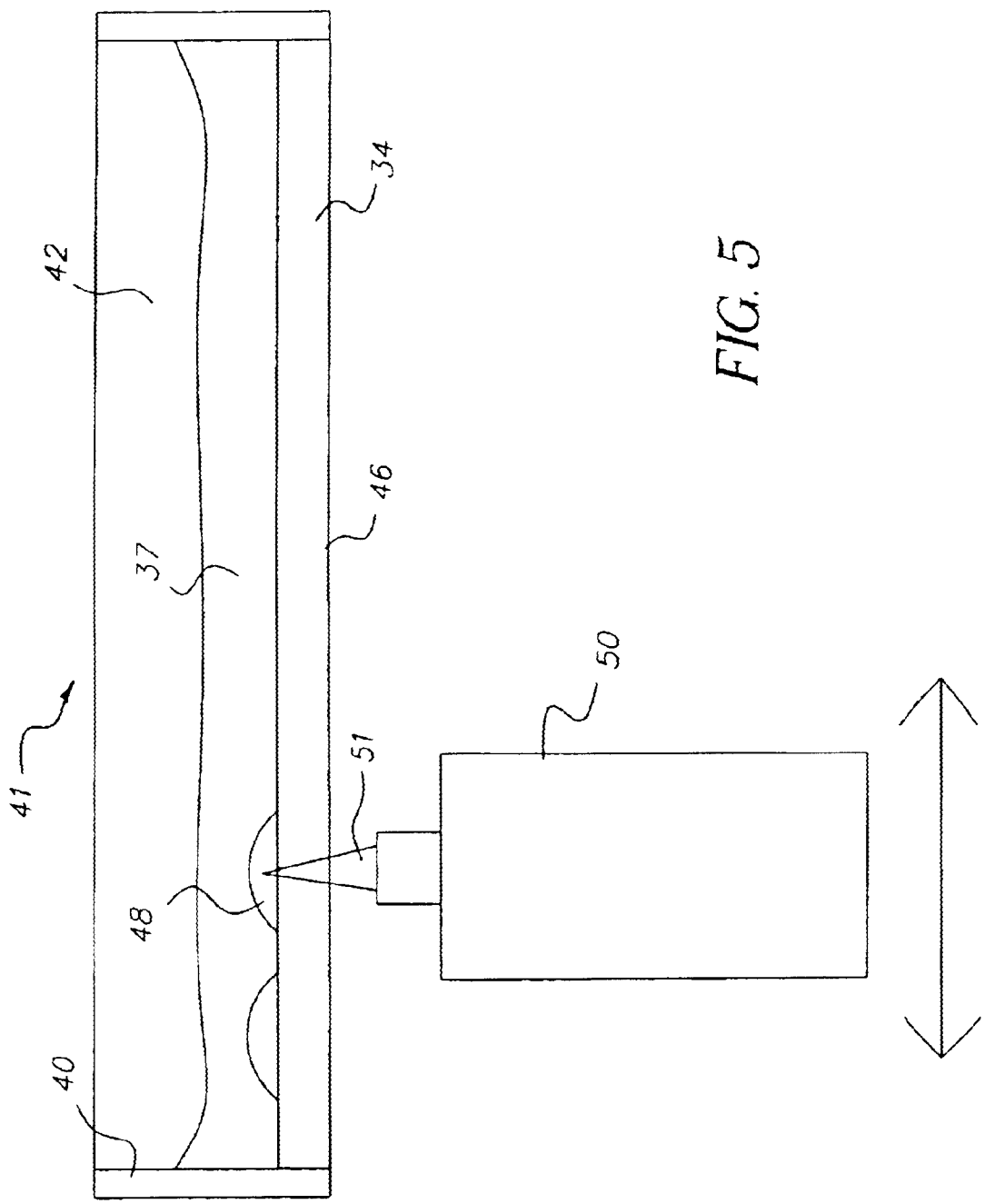
FIG. 5 is a cross-sectional schematic showing the photoresist contained in a pool on top of a transparent substrate and the laser located underneath the substrate such that the optical structure is created in the photoresist at the interface between the substrate and the photoresist in the practice of the method of the present invention.

FIG. 5 shows a schematic cross-sectional representation of the alternative apparatus 41 in which a thick layer of photoresist 37 has been placed on a transparent substrate 34. A laser 50 located on the opposite side 46 the transparent substrate 34 is shown producing a three-dimensional optical structure 48 in the photoresist 37 (see FIG. 5). The three-dimensional optical structures 48 are produced in the photoresist 37 by transmitting the beam 51 from the laser 50 in a controlled pattern through the transparent substrate 34 and into the thick layer of photoresist 37. In this method, the three-dimensional optical structures 48 are formed above the transparent substrate 34 up into the thick photoresist layer 37 so that the thickness uniformity of the photoresist 37 does not influence the accuracy of the three-dimensional optical structures 48 created. After exposing the photoresist 37 to create the predetermined three-dimensional pattern or features 48 using the laser positioned on the opposite side 46 of the transparent substrate 34, the exposed predetermined pattern is developed leaving an undeveloped portion. The undeveloped portion of the photoresist 37 is then removed if the photoresist is a negative photoresist or alternately, the developed portion is removed if the photoresist is a positive photoresist.

Figure 6:
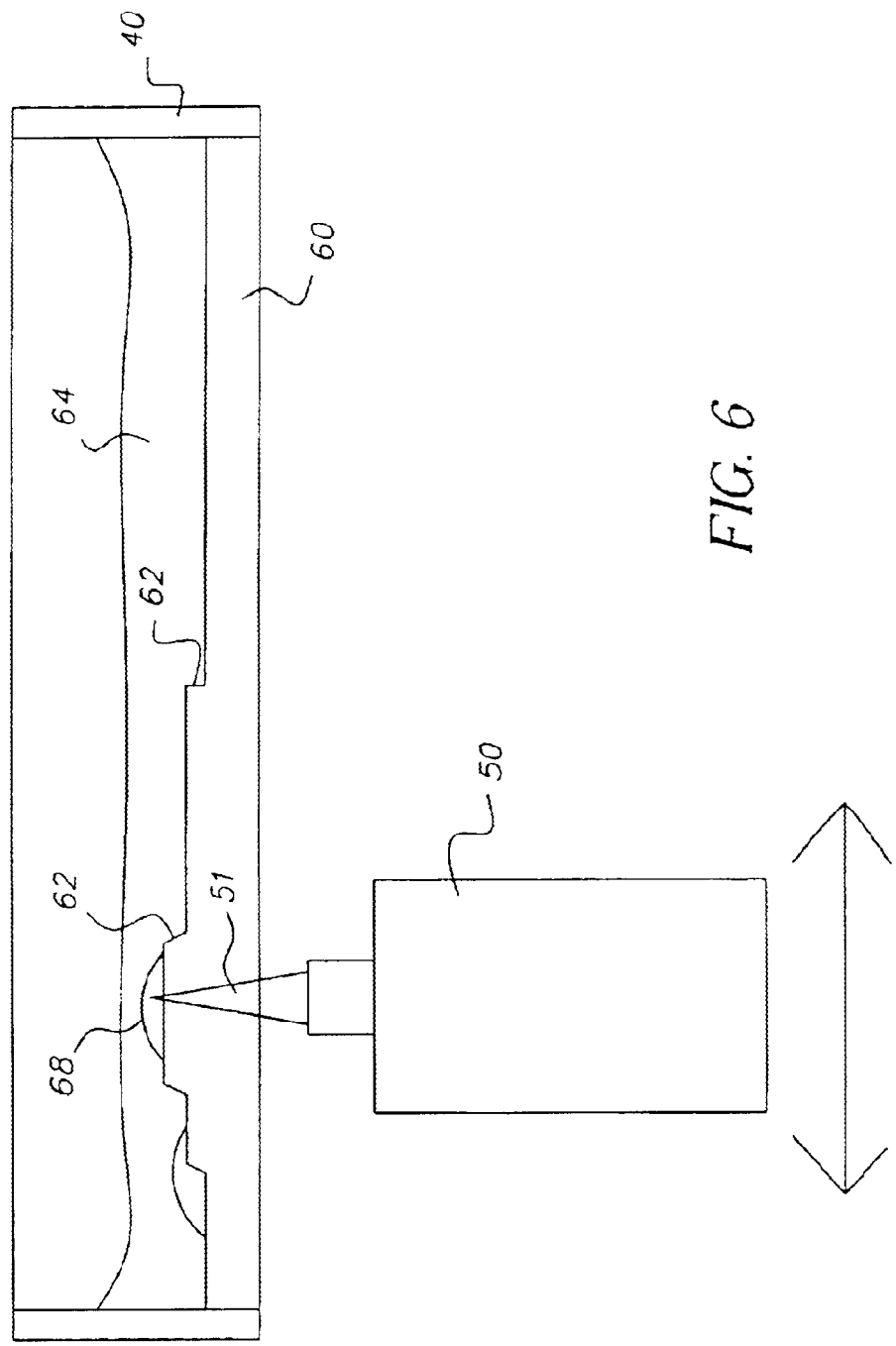
FIG. 6 is a cross-sectional schematic showing an alternate embodiment to that depicted in FIG. 5 wherein the substrate is contoured and a optical structure is being created in the photoresist over the contoured substrate using the method of the invention.

The present invention has been described herein using flat transparent substrates. However, the method of the present invention can also be employed with a non-planar substrate 60 as shown in FIG. 6. By way of example, substrate 60 may include three-dimensional contours or features 62. In this case, the pool of photoresist 64 is formed over the non-planar substrate 60 so that it covers the three-dimensional contours or features 62. By way of example, non-planar substrate 60 may be a transparent micro electromechanical system. A laser 50 emitting beam 51 is again used to create three-dimensional optical structures 68 in the photoresist.

It will be appreciated by those skilled in the art that the combination of moving the laser beneath a transparent substrate 34 along with the approach of starting with a pool of photoresist, makes it possible to make very deep optical structures from photoresist. In addition, the present invention substantially expands the effective thickness range over which photoresists, in general, can be used, and further, expands the effective thickness range for specific photoresists so that the number of choices of photoresists for a given optical structure is increased. In fact, the thickness limit for photoresist structures is extended by the present invention to the limit of light transmission for the photoresist at the wavelength at which the laser operates.

While the method described in the invention is applicable to nearly any laser or photoresist, for the laser to transmit light through the substrate and then to interact with the photoresist such that the liquid photoresist will solidify requires some balancing of the materials involved. For a typical UV laser such as an Excimer laser which operates at a wavelength of 248 nanometers, transparent substrates which can be used in the practice of the method of the present invention include, for example: sapphire, glass, quartz, lithium niobate, etc. Prefereably, the laser used in the process of the present invention is in the ultraviolet range or the visible range and operated at a wavelength of not more than about 500 nanometers. Most photoresists absorb strongly at UV wavelengths such as 248 nanometers so these combinations of lasers substrates and photoresists will perform as described in the practice of the method of the present invention.

The thickness of the transparent substrate can be an issue as well, particularly when a photomask (not shown) is used. In the practice of the method of the present invention, the photomask would have to be located on the same side of the transparent substrate as the laser as described above with reference to FIG. 5. Since the photomask would actually be separated from the photoresist, diffraction at the edges of the photomask will limit the sharpness of the image obtained on the photoresist and, therefore, the accuracy of the optical structure produced will be limited. To minimize these diffraction issues, the thickness of the substrate should be kept to a minimum when using a photomask.

The benefit of greater depth of the optical structures created that can be achieved through the practice of the method of the present invention versus the spin coating prior art method can be illustrated by comparing both methods using a particular photoresist. By way of example, the photoresist SU8 as produced by Microchem Corp of Newton, Mass., is recommended to be spin coated up to a thickness 500 microns. In contrast, the optical transparency limit is 2 millimeters for SU8 at the photoresist's most sensitive wavelength (365 nanometers). This data supports a conclusion that the possible depth achieved in the optical structures formed in the photoresist is increased by a factor of four, using the method of the present invention wherein the photoresist is applied as a pool onto a sapphire, glass or quartz substrate as opposed to spin coating.

From the foregoing it will be seen that this invention is one well adapted to attain all of the ends and objects hereinabove set forth together with other advantages which are apparent and which are inherent to the process.

It will be understood that certain features and subcombinations are of utility and may be employed with reference to other features and subcombinations. This is contemplated by and is within the scope of the claims.

As many possible embodiments may be made of the invention without departing from the scope thereof, it is to be understood that all matter herein set forth and shown in the accompanying drawings is to be interpreted as illustrative and not in a limiting sense.

Parts List

10 Spin Coating Apparatus
11 Liquid Photoresist
12 Substrate
13 Tube
14 Layer
16 Edge
17 Edge Of Coated Layer Of Photoresist
18 Laser
20 Substrate
21 Prior Art Process
22 Photoresist Coating
23 Structure
29 Apparatus
30 Liquid Photoresist
32 Container
34 Transparent Substrate
36 Pool Of Photoresist
37 Photoresist
38 Top Surface
40 Vertical Wall Member
41 Alternative Apparatus
42 Chamber
46 Opposite Side Of Transparent Substrate
48 Optical Structure
50 Laser
51 Emitting Beam
60 Non-Planar Substrate
62 Three-Dimensional Contour Of Features
64 Pool Of Photoresist
68 Three-Dimensional Optical Structures

What is claimed is:

1. A method for generating optical structures in a photoresist comprising the steps of:

(a) forming a pool of photoresist on a first side of a transparent substrate;

(b) exposing the photoresist to create a predetermined three-dimensional pattern of optical structures using a laser positioned on second side of the transparent substrate opposite the first side by moving the focal point of a beam from the laser in a controlled pattern to define the optical structure;

(c) developing the exposed predetermined pattern leaving a developed portion and an undeveloped portion; and (d) removing either the developed portion or the undeveloped portion of the photoresist.

2. A method as recited in claim 1 wherein:

a surface of the first side of the transparent substrate is substantially planar.

3. A method as recited in claim 1 wherein:

a surface of the first side of the transparent substrate includes three-dimensional contours or features.

4. A method as recited in claim 1 wherein:

the transparent substrate is sapphire, quartz, glass, or lithium niobate.

5. A method as recited in claim 1 further comprising the step of:

placing a perimetric wall around the transparent substrate to create a chamber in which the photoresist can be pooled over the entire first side of the transparent substrate.

6. A method as recited in claim 1 wherein:

the laser operates at a wavelength of not more than about 500 nm.

7. A method as recited in claim 1 wherein:

the laser operates at a wavelength of about 248 nm.

8. A method as recited in claim 1 wherein:

the predetermined three-dimensional pattern includes optical structures having a depth of at least 100 microns.

9. A method as recited in claim 3 further comprising the step of:

placing a perimetric wall around the transparent substrate to create a chamber in which the photoresist can be pooled over the entire first side of the transparent substrate.

10. A method as recited in claim 9 wherein:

the predetermined three-dimensional pattern includes optical structures having a depth of at least 100 microns.

* * * * *